United States Patent [19]

Jerome et al.

[11] Patent Number: 4,536,866
[45] Date of Patent: Aug. 20, 1985

[54] INFORMATION RETRIEVAL SYSTEM AND APPARATUS

[75] Inventors: Jonathan A. Jerome, Palo Alto; Frank D. Neu, Castro Valley; Peter G. Wohlmut, Palo Alto, all of Calif.

[73] Assignee: Videonics of Hawaii, Inc., Honolulu, Hi.

[21] Appl. No.: 455,307

[22] Filed: Jan. 3, 1983

Related U.S. Application Data

[63] Continuation of Ser. No. 964,977, Nov. 30, 1978, abandoned, which is a continuation of Ser. No. 797,485, May 16, 1977, abandoned.

[51] Int. Cl.³ ............................................. G11B 7/00
[52] U.S. Cl. .................................. 369/112; 358/213; 358/342
[58] Field of Search .................... 369/48–50, 369/100, 109–112, 120–122; 365/215, 120, 124, 127; 360/71, 63; 250/202; 235/435; 358/342, 213

[56] References Cited

U.S. PATENT DOCUMENTS

| | | | |
|---|---|---|---|
| 3,158,846 | 11/1964 | Silverman | 360/71 |
| 3,609,373 | 9/1971 | Desai | 250/202 |
| 3,780,266 | 12/1973 | Mudsam et al. | 235/435 |
| 4,003,089 | 1/1977 | Mauer | 360/63 |

FOREIGN PATENT DOCUMENTS 2320857 4/1973 Fed. Rep. of Germany ...... 365/215

*Primary Examiner*—Robert L. Richardson
*Attorney, Agent, or Firm*—Lyon & Lyon

[57] ABSTRACT

A system and apparatus is disclosed for retrieving analog or digital information stored on an optically sensed disc. In a preferred embodiment, a video disc is disposed between a flooding light source and a matrix array of photosensitive elements, there being provided optical focusing means so that the illuminated data tracks of the video disc are imaged onto the photosensitive array. Circuitry is provided for sensing output signals from selected elements of the array and in response thereto selecting those elements of the array onto which the selected track (or tracks) is best imaged. In this manner the apparatus of the present invention can provide data track following, conventional data retrieval and parallel simultaneous and sequential data retrieval. Alternative circuitry provides signal stream manipulation to compensate for fluctuations in rotational velocity of the data disc and to provide improved signal-to-noise ratios as well as frequency response enhancement. Other alternative circuitry permits compensation for lost data.

46 Claims, 13 Drawing Figures

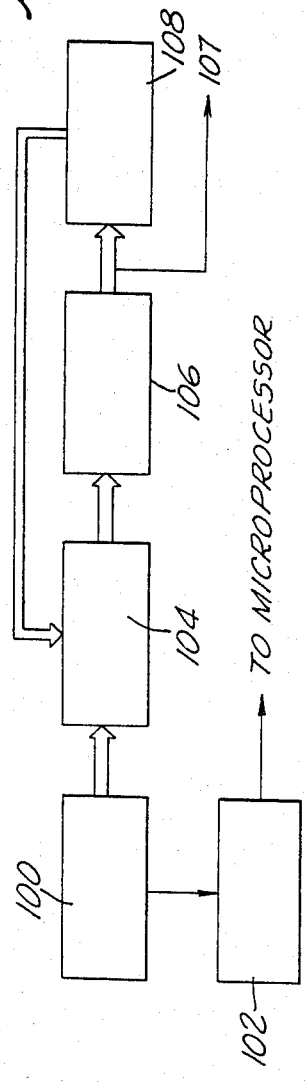
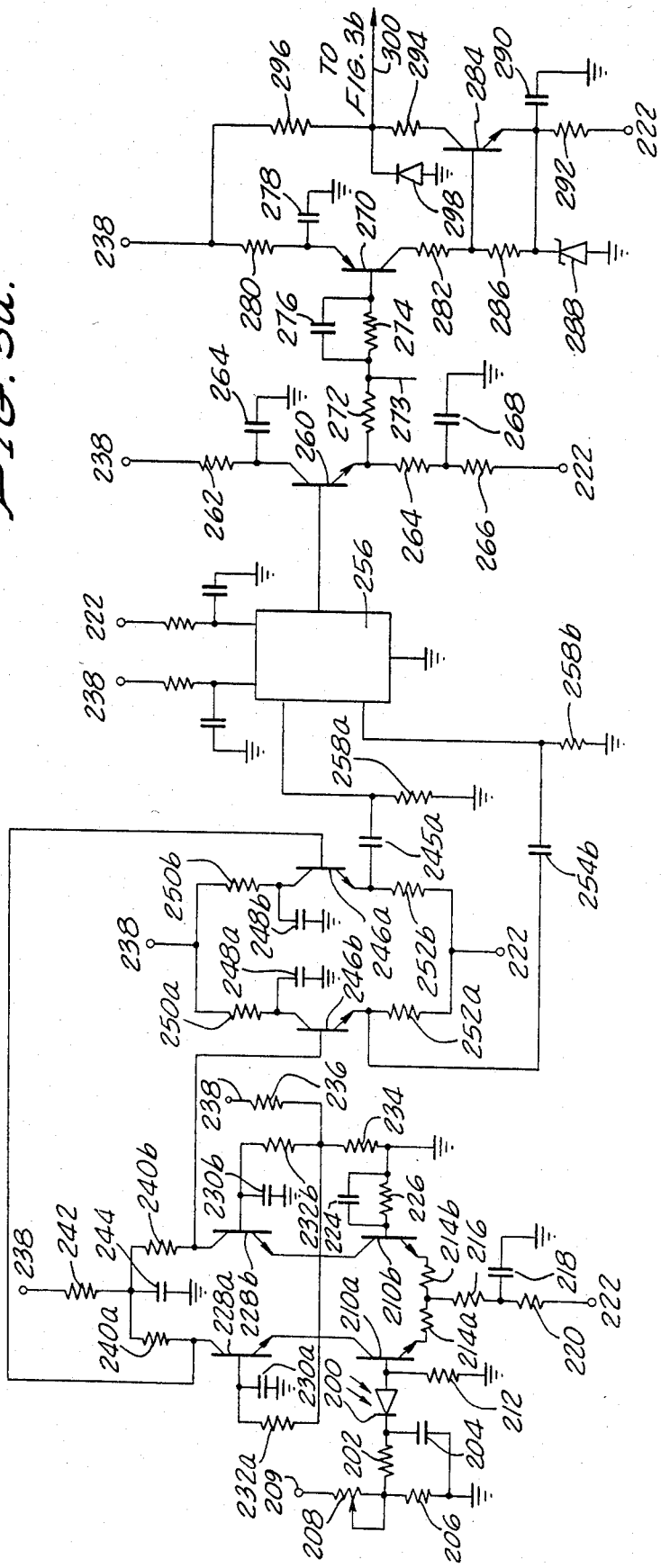
Fig. 2
Fig. 3a.

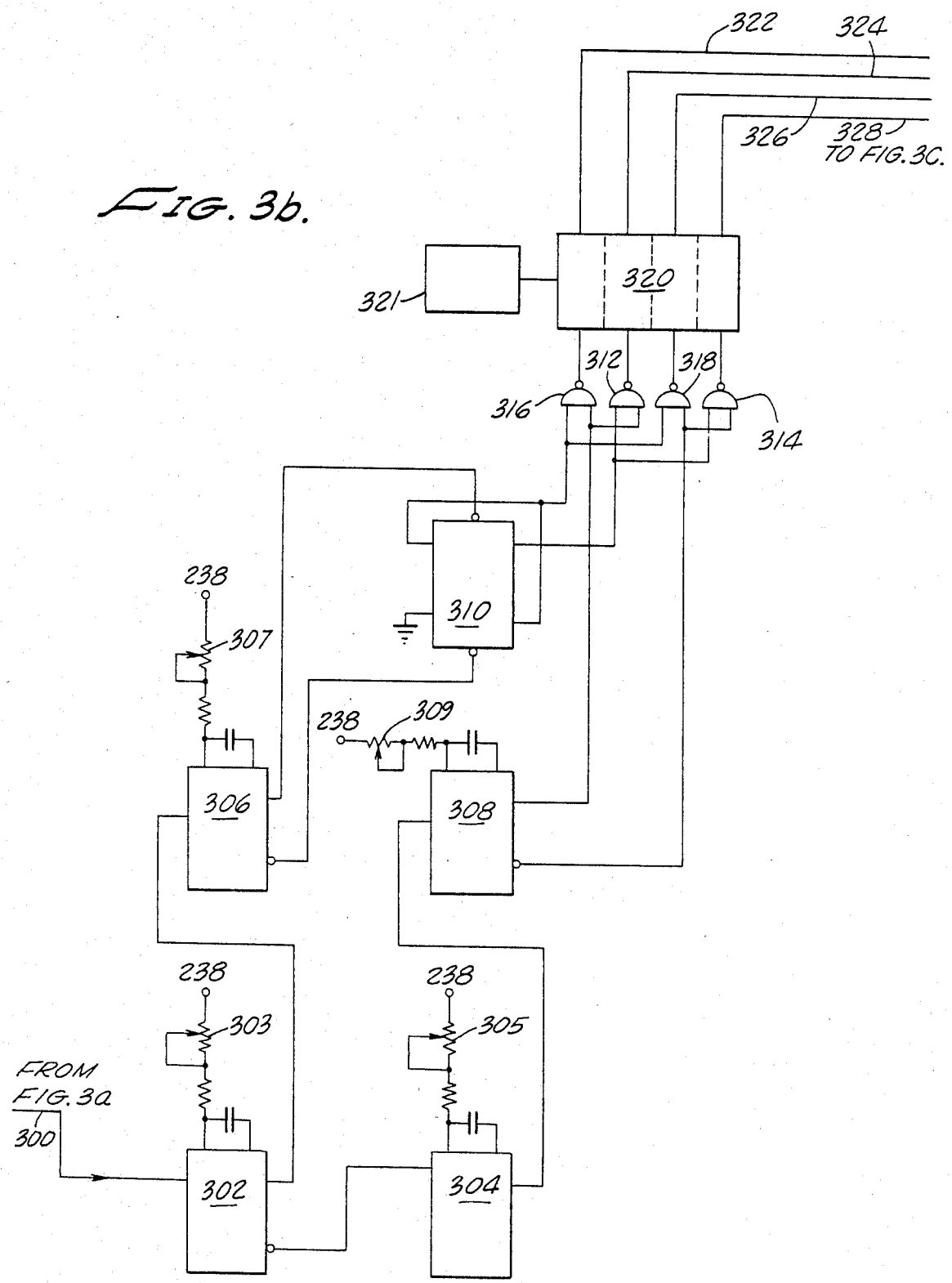

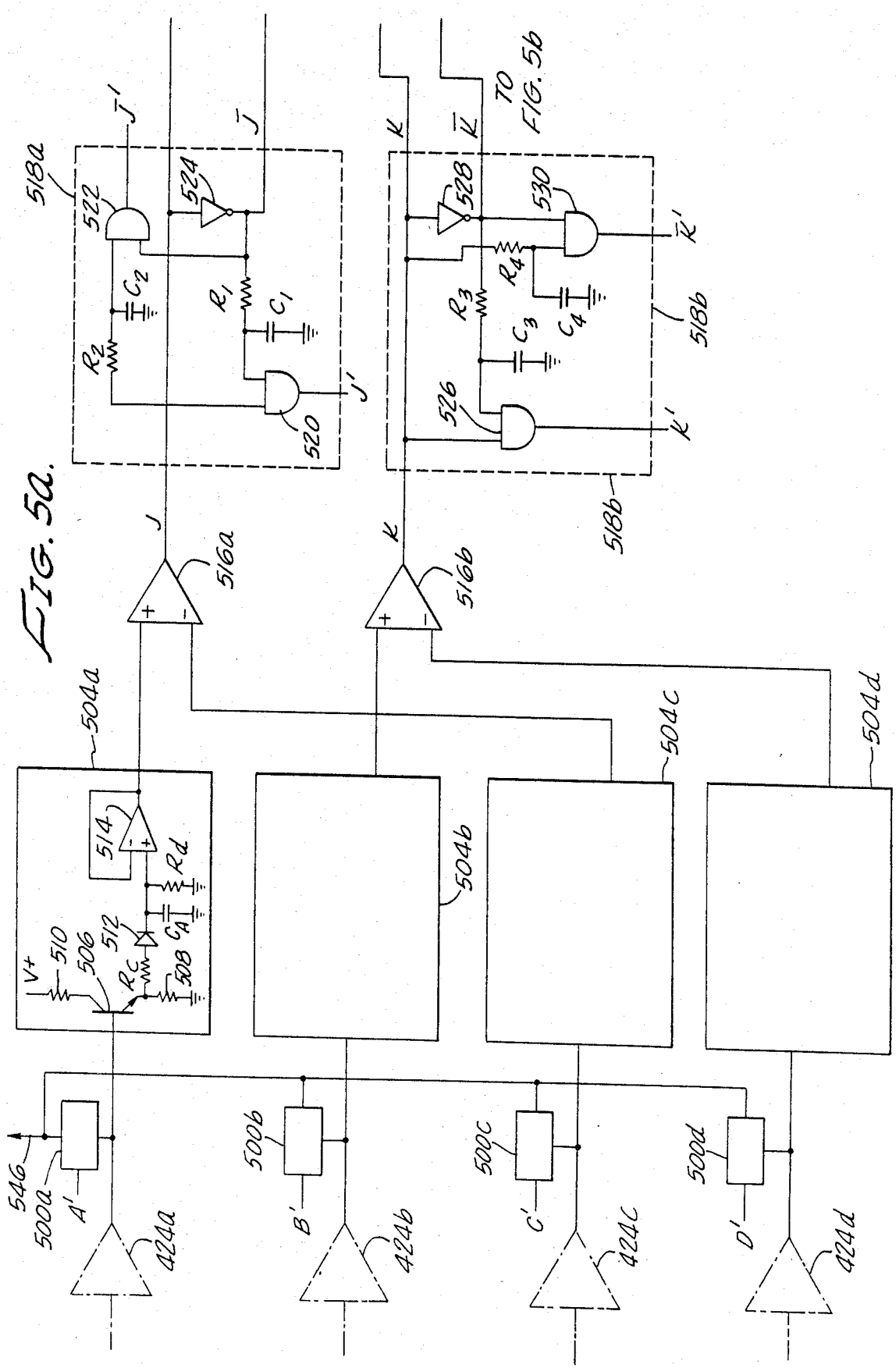

INFORMATION RETRIEVAL SYSTEM AND APPARATUS

This is a continuation of application Ser. No. 964,977, filed Nov. 30, 1978, now abandoned and which in turn was a continuation of application Ser. No. 797,485 filed May 16, 1977 and also abandoned.

FIELD OF THE INVENTION

This invention relates generally to information retrieval systems, and more particularly to information disc display systems which employ imaging techniques.

BACKGROUND OF THE INVENTION

Video display systems wherein information is stored on a substantially transparent disc are well known in the prior art, for example, see Bouwhuis U.S. Pat. No. 3,855,426; Gregg U.S. Pat. No. 3,430,966; Feinlieb U.S. Pat. No. 3,626,336; and Johnson U.S. Pat. No. 3,518,442. While these patents describe focusing video systems wherein a light source is focused on that part of the video disc where the subject information is recorded, imaging video display systems are also known in the prior art. See Wohlmut et al U.S. Pat. Nos. 3,848,095 and 3,946,367, the disclosures of which are incorporated herein by reference.

In imaging video systems, a light source floods an area of the disc, rather than being focused on a particular portion thereof. Light passing through the disc is modulated in accordance with the information stored thereon. This modulated light forms an image of the track itself and is focused by an objective lens onto a photosensitive detector. The photosensitive detector produces an output responsive to the modulated light impinging thereon, which is therefore suitable for use an an input to conventional display circuitry. While these prior art video systems have functioned well, certain difficulties have existed resulting in less than optimal reproduction of the stored information.

One of these difficulties has been unavoidable eccentricities of the data track on the disc during playback. Due to the mechanical means used to drill spindle holes, and also nonuniformities in the disc material, the spindle hole may be positioned away from the geometric center of the disc. As a result, fluctuations in data track radius of up to 125 microns may occur. Also, simple nonuniformities in the disc material may cause the data track spacing to vary; mechanical vibrations may also cause unwanted variation. Since the track spacing on the discs is typically 2.2 microns center-to-center, and the tracks themselves are typically 1.1 microns wide, such miscentering can result in an error of greater than one track. Therefore, it is desirable for the detection system of the playback unit to tolerate eccentricities in track radius of at least 125 microns. While photosensitive devices have been used to detect changes in a slowly varying medium, see for example Desai U.S. Pat. No. 3,609,373, such devices have not been applied to the present problem of following a fluctuating, rapidly rotating data track.

Another difficulty which has occurred relates to actual readout of the track information. A typical system may use mirrors and galvanometers to determine the location of the selected data, to permit data readout. The mechanical limitations of such devices inherently result is some misalignment which in turn degrades the ultimate information display. Furthermore, the response time of such mechanical devices is generally too slow to accurately monitor a rapidly varying medium. It is therefore useful to provide a system not limited by the slow response times and misalignment inherent in mechanical systems.

Also, prior art systems have typically been limited to readout of the information stored on a single segment of a spiral track covering the disc. For various applications, specifically video games, message scramblers, digital information and video graphics, it is desirable to simultaneously read out information contained on parallel tracks. Therefore, it is desirable to provide a system wherein parallel simultaneous and parallel sequential read modes are possible.

Another difficulty with the prior art has been nonuniformity in rotational velocity of the video disc. Since the information on the video track is spaced at regular intervals, accurate reproduction of the stored information requires data flow to be maintained at a constant rate. With a video disc system, this requires a constant rotational velocity. Slight fluctuations in disc velocity are unavoidable, thus the fluctuations in disc velocity must be compensated for to provide the requisite uniform information flow. While systems for providing time base correction exist in the prior art, such systems are prohibitively expensive for a commercially practical system. Therefore it is desirable to provide a system which can economically compensate for such variations in track velocity.

Poor signal-to-noise ratio during playback has been another cause of degraded video signal in prior art devices. The prior art systems typically use a single detector or occasionally a pair of detectors to transform the variations in transmitted light representing the information stored on the data track into usable electrical signals. With such a small number of detectors, the information readout is susceptible to various noise sources such as fluctuations in light source intensity. Since only a small number of detectors are used in the prior art this source of noise is reflected directly in the video display. While improving the signal-to-noise ratio in a system having only a small number of detectors is possible by using complex and expensive circuitry, such a system is economically infeasible. It is therefore desirable to provide an improved detector system wherein an improved signal-to-noise ratio is provided.

A further difficulty frequently found with display of video information is that the information is so densely packed that occasional imperfections in the disc or debris on the disc cause the quality of the stored information to deteriorate. For example, sometimes the presence of dust or scratches will entirely obliterate a portion of the information to be played back. It is therefore desirable to provide a method and means for reproducing such information in spite of such debris and imperfections.

Another difficulty with the prior art has been degradation in frequency response. Frequency response can generally be regarded as indicated by the sharpness of the sync pulse which begins a time of video information. Because of inherent optical and mechanical limitations, a sync pulse which is ideally a square pulse in reality exhibits some round-off. This round-off in turn indicates some loss of frequency response, especially at higher frequencies such as two megahertz and above. Since the bandwidth of black and white information may exceed two megahertz, and color information requires a bandwidth of 3.58 megahertz, noticeable degradation of image quality occurs with even small amounts of rounding-off of the sync pulse. Thus a system which can compensate for losses in frequency response is desirable.

Poor focusing has been a problem with certain other prior art systems. Loss of focus can result in a degraded color or other reference signal, as well as other signal degradation, which causes a proportionate decrease in information quality. The typical prior art systems have involved opto-mechanical systems or systems for oscillating a lens over a slight distance to provide good focusing. However, such systems are typically not economically suitable for maintaining an optimum focus at high data packing, where good focus becomes critical.

One object of the present invention is to provide an improved means for following the data track of a disc despite eccentricities in the disc.

Another object of the present invention is to provide an improved means for readout of track information.

Another object of the present invention is to provide for parallel simultaneous and sequential readout of stored data.

Another and further object of the present invention is to compensate for variations in rotational velocity of a storage disc.

Another object of the present invention is to provide means for improving the signal-to-noise ratio of stored information during playback.

Another object of the present invention is to provide means for dropout compensation where information stored at a high packing density is lost.

Another object of the present invention is to provide means for enhancing the frequency response of the storage medium.

Other and further objects of the present invention will be apparent from the subsequent detailed description.

SUMMARY OF THE INVENTION

The present invention employs a matrix array of photosensitive elements typically having a plurality of independently monitored diodes disposed along an axis of the array. Generally, the array is an M×N arrangement of elements, comprising a total of 256 or more diodes. However, some applications only require a single row of diodes (i.e., M=1). For some applications, the selected elements of the array are disposed orthogonally to the data track or tracks of a video disc, at a distance therefrom suitable to permit imaging of the data track or tracks onto the array. The array is preferably of sufficiently large dimension to ensure that, despite variation in track position, the data track is imaged onto one or more of the array elements.

Because the transmission of light through the data track is distinguishable from light passing through the substrate comprising the remainder of the disc, proper monitoring of the array output will indicate the location of the track image with respect to the array. In the event of a nonuniformity in the data track, i.e., a nonuniformity of data track position on the disc, the track image will no longer fall on the same elements in the array. If, as in the prior art, only a predetermined number of elements were continuously monitored, degradation of the output signal would result from the nonuniformity.

The present invention, however, provides means for detecting such loss of signal and rapidly altering the diodes to be monitored. Since the size of the array is typically greater than the eccentricity in the data track, such rapid detection and switching permits virtually continuous monitoring of the data track. The switching is preferably performed during nondata intervals such as the horizontal retrace interval for video information, but may be performed at any time. Each element of the array is maintained in a biased state to minimize delay times associated with switching. This means that a signal is present on all elements of the array at all times and any data track may be selected by monitoring the associated preamplifier. It should be noted that a group of several elements may be used to follow a single data track, and that some elements may have to be added to, and other elements dropped from, the group to follow the varying position of the data track. If such reselection of the group is required, the array is switched to simultaneously add and drop the appropriate elements, while maintaining the desired order of the newly added elements with respect to those retained from the previous group. The entire array may be simultaneously switched in this kind of grouping.

As described in the prior art, the actual information stored on a single data track may be read out by monitoring the signal variations from the diodes onto which the data track is imaged. The switching capability of the present invention, however, also permits parallel sequential and simultaneous playback of the information stored on multiple tracks since the photosensitive array extends across the image of several data tracks. Simultaneous parallel readout may be had by monitoring those diodes onto which the selected data tracks are imaged, while sequential paralled readout may be obtained by monitoring a selected segment of a first track, switching to and monitoring a diode onto which a selected segment of a parallel track is imaged, then switching to another diode (and track image), and so on. Because the switching occurs rapidly, or may be timed to occur in nondata intervals such as the video horizontal retrace, a relatively continuous display is perceived.

Dropout compensation may also be provided with the present invention. Video information is typically highly redundant, so that substantially identical information is stored in the data tracks adjacent to any given track. Because of this redundancy and the rapid switching possible with the present invention, information lost from a single track may be compensated by reading on adjacent racks. The result is a relatively continuous data flow despite the information lost from the originally monitored track.

In another object of the present invention, it is possible to compensate for fluctuations in disc rotational velocity (sometimes referred to hereinafter as time base correction). By selecting elements in the array which are tangentially disposed to the data tracks of the video disc, several elements of the photosensitive array fall within the image of a single track. With this arrangement, it is possible to compensate for fluctuations in rotational velocity by switching from the preferred detection element to an element positioned either ahead of or behind the preferred element. It can be seen that the optimum positioning of these alternative detectors depends upon the fluctuation in disc velocity; by providing a suitably sized array, a properly positioned element can be monitored for virtually any velocity fluctuation. Thus, if fluctuations in radial velocity cause the information to present at the preferred element too early (increased rotational velocity), the element positioned at some point behind the preferred element permits the information to be detected at the proper time.

Conversely, if the information arrives at the preferred element too late (decreased rotational velocity), the element positioned at some distance ahead of the preferred element may be monitored for proper detection.

Another embodiment of the present invention is useful for improving signal-to-noise ratio of the stored information during playback. When elements of the array which are disposed tangentially to the data track are selected, several elements of the array fall within the spacing of the image of a single track. By monitoring the output of each such element, the information stored on the data track appears several times as the information rotates past the array. By delaying the output of each element to compensate for the time differences at which the data is directed by each element, the proportionately delayed output of all of these elements may be summed to yield a single increased output signal. If a major source of noise is random fluctuation in light intensity, the stored information signal will add linearly with the number of elements, while the noise portion of the signal will increase according to a root-mean-square relation. Therefore, the tangentially disposed elements of the photosensitive array, and associated electronics, will provide an increased signal-to-noise ratio.

Another feature of the present invention is the capability of providing frequency response enhancement. As noted previously, round-off of the sync pulse is associated with degradation of high frequency signals, such as the 3.58 megahertz video color signal. The present invention provides circuitry for detecting the extent to which the sync pulse has rounded off, and in response thereto selectively activating frequency emphasis circuitry to enhance those frequencies which have degraded. In this manner the signal may be substantially restored to its non-degraded state, or the frequency response of the data retrieval system has been improved.

DESCRIPTION OF THE DRAWINGS

FIG. 2 illustrates in block diagram form the photosensitive array and associated electronics of a preferred embodiment of the present invention.

FIGS. 3a-3c taken together schematically illustrate an exemplary portion of the photosensitive array, timing, preamplifier and amplifier circuitry of a preferred embodiment of the present invention FIG. 3a is connected to FIG. 3b as indicated. FIG. 3b is in turn connected to FIG. 3c as indicated.

FIGS. 5a-5b taken together schematically illustrate circuitry for selecting specified elements of the photosensitive array FIG. 5a is connected to FIG. 5b as shown.

DETAILED DESCRIPTION OF THE INVENTION

Figure 1A:
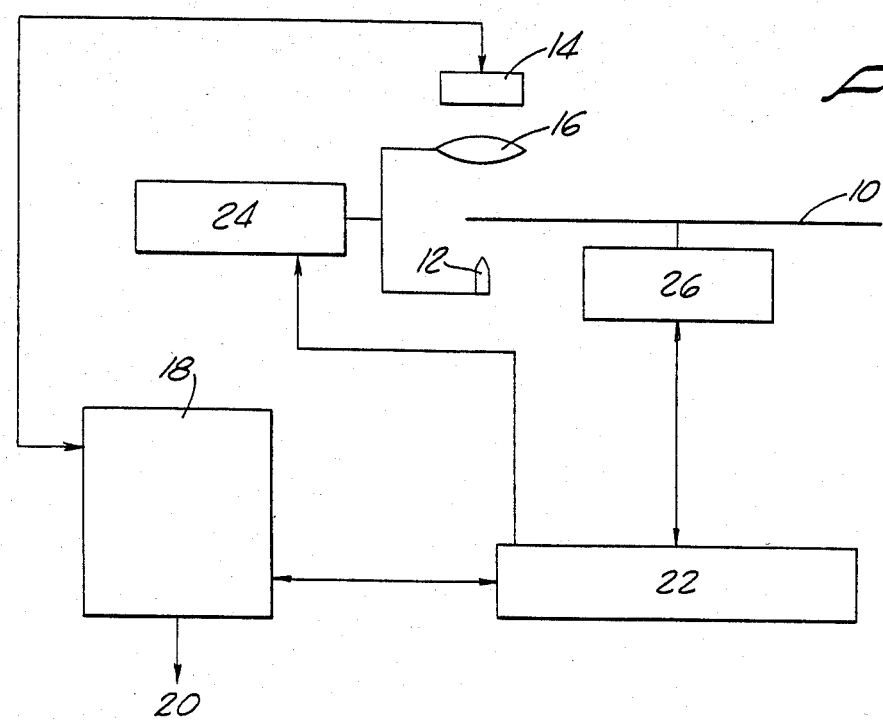
FIG. 1a illustrates in block diagram form the data retrieval system of a preferred embodiment of the present invention.

Referring now to FIG. 1a, there is generally shown therein, in block diagram form, a preferred embodiment of the data retrieval system of the present invention, some portions of which are described more particularly in U.S. Pat. Nos. 3,848,095 and 3,946,367. An optically sensitized disc 10 is disposed between a light source 12 and matrix array of photosensitive elements 14. The light source 12 is typically an incandescent bulb, but laser, infrared and ultraviolet sources may be readily implemented. Focusing means 16 is provided so that data tracks on the disc 10 may be sharply imaged onto the photosensitive array 14, as better seen in FIG. 1b. In this manner the data stored on the rotating disc 10 is converted to electrical signals by the array 14.

The output signals from the array 14 are then amplified and operated upon by signal processing circuitry 18, which provides a video output signal 20 and also provides a signal to controller 22. The controller 22 controls a head positioning unit 24 and servo-controlled disc rotating unit 26, to provide substantially constant rotation of the data disc 10 and substantially uniform movement of the light source 12, array 14 and associated data readout. With this system the data stored on the disc 10 may be readily retrieved.

The present invention is in major portion directed to improvements in the signal processing circuitry 18 and photosensitive array 14. Taken together, the combination of the photosensitive array 14 and signal processing circuitry 18 permit solution of many problems inherent in prior art systems. Basic to an understanding of the present invention is the technique of imaging the data tracks of a data disc onto the photosensitive array 14, as shown in FIG. 1b.

Figure 1B:
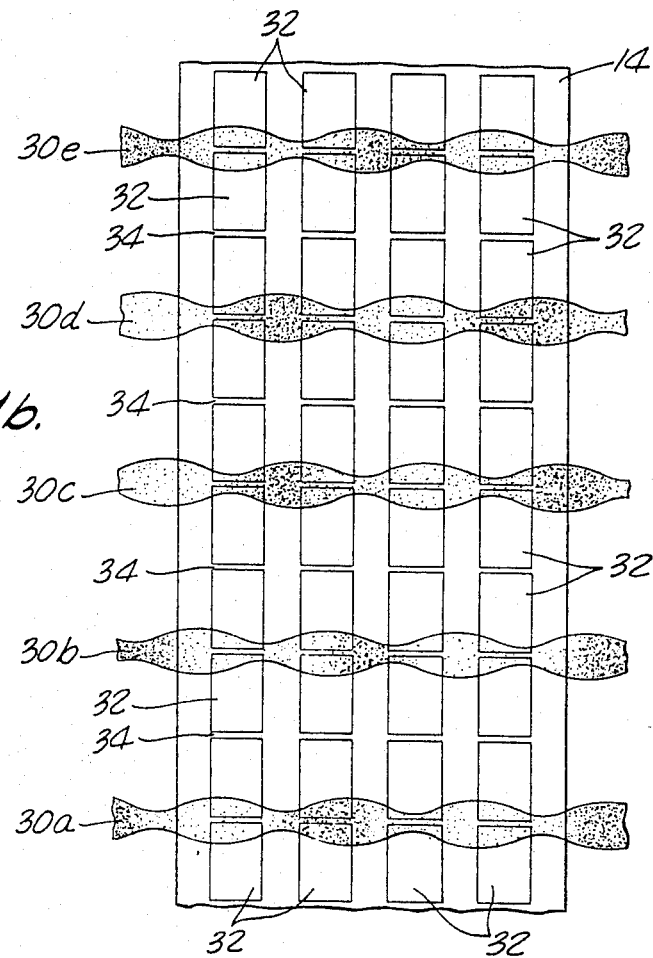
FIG. 1b illustrates a plurality of data tracks imaged on a portion of a photosensitive array typical of the operation of the present invention.

In FIG. 1b, five data tracks 30a-e are shown imaged on a portion of a photosensitive array 14 having a plurality of elements 32, the portions illustrated being arranged in a matrix of four rows and ten columns. The photosensitive array 14 is preferably manufactured as a monolithic array of the elements 32, typically having 256 or more photosensitive elements, the exact number being dependent on the type of data to be retrieved. For some applications the matrix 14 need only comprise a single row of elements 32 and only a few columns of elements 32; for highly sophisticated data retrieval systems a much larger array may be required. Each element is typically an avalanching photodiode having electrical characteristics similar to those of the Texas Instruments TXL-56. However, photo-FET's and charge-coupled devices having suitable frequency response are also acceptable.

Dimensions of the individual elements 32 may also vary with application. For most applications the preferred shape of the photodiode or element 32 is slightly rectangular with approximately 10 mil center-to-center spacing between adjacent elements. The guard band 34, or isolation zone, between adjacent elements 32 is preferably as small as possible to maximize usable detector area. Each element is of such a dimension that the image of a single data impinges upon substantially the entire surface of at least one, and for many applications two, elements.

During normal operation, the position of the selected data track will vary with respect to the photosensitive array 14. Likewise, the data track image, for example track image 30d, will vary in position on the elements 32 which make up the array 14. Although the exemplary data track images 30a–30e illustrated in FIG. 1b are shown impinging on the array 14 at the guard bands 34, it should be understood that this situation will occur only occasionally. The preferred position is for a selected data track image to impinge evenly on a single column of elements 32, although it is one feature of the present invention that acceptable data retrieval is possible even when the data track is imaged on the guard band between elements.

Referring now to FIG. 2, there is illustrated therein, in block diagram form, the subparts which comprise the signal processing circuitry 18 and photosensitive array 14 shown in FIG. 1a. The photosensitive array 100 provides a signal to horizontal sync pulse circuitry 102 and also provides a plurality of signals to preamplifier circuitry 104. As will be discussed in connection with FIGS. 3a–c, although each element of the array 100 continuously provides an output signal to the preamplifier circuitry, only selected elements thereof are monitored. The sync pulse circuit 102 provides a timing pulse to a microprocessor (not shown). The output signal from the preamplifier circuitry 104 is amplified by amplifier circuitry 106. The amplifier circuitry 106 provides a conventional video signal 107, or in some applications a plurality of signals, and also provides a plurality of signals to select circuitry 108. Select circuitry 108 monitors the output signals of a plurality of typically adjacent photosensitive elements, and provides a switching signal to preamplifier circuitry 104 for selecting which photosensitive element outputs are to be monitored. As will be discussed in greater detail in connection with FIGS. 3a–c and 5a–b, select circuitry 108 selects the element or elements of the array 100 which provide the best output signal. The select circuitry means 108 thereby selects at least one of said photosensitive elements of array 100 thereby to provide an output signal of the system.

Figure 3C:
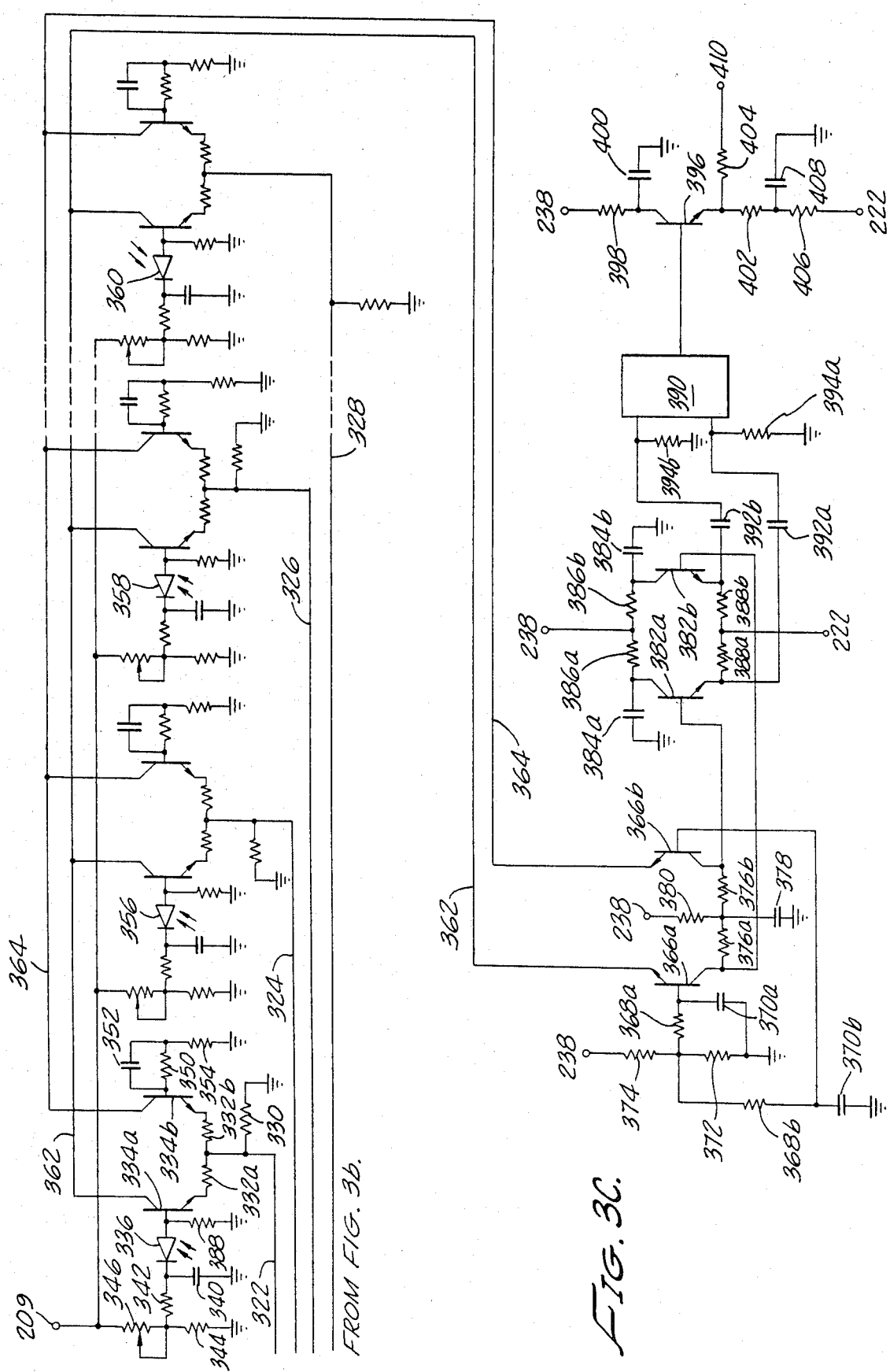

Referring now to FIGS. 3a–c, there is shown in detail therein a schematic diagram of the circuitry comprising exemplary portions of photosensitive array 100, sync circuit 102, preamplifier circuitry 104 and amplifier circuitry 106. Attention is directed to FIG. 3a, which illustrates the sync pulse circuit 102.

A photodiode 200 (part of the array 100) is shown biased by a network comprised of a resistor 202 connected to the cathode of the photodiode 200, a capacitor 204 connected between the cathode of the photodiode 200 and ground, and a pair of resistors 206 and 208 forming a voltage divider network with the centerpoint thereof connected to the remaining terminal of the resistor 202. The remaining terminal of the resistor 206 is tied to ground and the remaining terminal of the variable resistor 208 is tied to a voltage supply 209 such as 200 volts. The anode of the photodiode 200 is tied to the base of a transistor 210a, and also to one terminal of a resistor 212, the other terminal of which is grounded. Thus the photodiode 200 is maintained in a continuously biased state and provides an output signal (to the base of transistor 210a) responsive to the data track image impinging thereon.

The transistor 210a forms one half of a differential pair, the remaining half being formed by the transistor 210b. The emitters of the NPN transistors 210a–b are connected respectively to resistors 214a and 214b. The remaining terminal of each of the resistors 214 is connected to one terminal of resistor 216. The other terminal of the resistor 216 is connected to a capacitor 218, the remaining terminal of which is grounded, and a resistor 220, the remaining terminal of which is connected to a second voltage supply 222, for example, −15 volts.

The base of the transistor 210b is connected to a capacitor 224 and a resistor 226, the remaining terminals of which are connected to ground. The capacitor 224 is equal in value to the capacitor 204; similarly, the value of the resistor 226 is typically equal to the value of the resistor 212. The collectors of the transistors 210a–b are respectively connected to the emitters of another differential pair comprising transistors 228a and 228b. The transistors 230a–b and a pair of resistors 232a–b. One terminal of each of the capacitors 230a–b is connected to the base of the transistors 228a–b, respectively, and the remaining terminal is grounded; similarly, the resistors 232a–b are connected to the bases of the transistors 228a–b, respectively, and are joined together at the remaining terminals thereof.

The junction of the resistors 232a–b is connected to a resistor 234, the remaining terminal of which is tied to ground. A resistor 236 is connected between the junction formed by the resistors 232a–b and a third voltage supply 238, for example, +15 volts. The collectors of the transistors 228a–b are connected to a pair of resistors 240a–b, the remaining terminals of which are joined together and connected to a resistor 242. The remaining terminal of the resistor 242 is connected to the voltage supply 238. A capacitor 244 is typically connected to the junction of the resistors 240a–b and the remaining terminal thereof is grounded.

Those skilled in the art will recognize that the above circuit, comprised in major portion of the differential pairs 210a–b and 228a–b, is a preamplifier configured in a current sensing mode. This current sensing configuration has been found advantageous in permitting fast switching time between selected elements as required for rapid data retrieval, when the elements are avalanching photodiodes or the like. However, voltage sensing is preferred for optical FET's. Such rapid data retrieval is required in video playback, at the frequency response necessary for video reproduction, or in retrieval of digital information. The preamplifier output signals are taken from the collectors of the transistors 228a–b, which provide inputs to an amplifier stage of the horizontal sync pulse circuit by providing base drive to a differential pair of transistors 246a–b. The collectors of the transistors 246a–b are connected to biasing capacitors 248a–b, respectively, the remaining terminals of which are grounded. Also connected to the collectors of the transistors 246a–b, respectively, are resistors 250a–b, the remaining terminals of which are connected to the voltage supply 238.

The emitters of the differential pair 246a–b are connected to resistors 252a–b, the remaining terminals of which are connected to the voltage supply 222. The emitter of the transistor 246a is also connected to a capacitor 254a, the remaining terminal of which forms one input to a differential amplifier 256. Similarly, the emitter of the transistor 246b is coupled to the remaining input of the amplifier 256 through a capacitor 254b.

The inputs of the amplifier 256 are also tied to ground through resistors 258a and 258b, respectively. The differential amplifier 256 is typically a Motorola 1445 amplifier, biased in a conventional manner.

The output of the amplifier 256 provides an input to an emitter follower stage by providing base drive to a transistor 260, the collector of which is connected to the voltage supply 238 through resistor 262. The collector is also connected to ground through a capacitor 264. The emitter of the transistor 260 is connected to the second voltage supply 222 through a pair of resistors 264 and 266. A capacitor 268 is connected at the junction of the resistors 264 and 266, the remaining terminal of the capacitor 268 being connected to ground.

The output of the stage is taken from the emitter of the transistor 260 which drives a pnp transistor 270 of a "stripper" circuit through a pair of series-connected resistors 272 and 274. It will be recognized that a complete, amplified video signal is present at an auxiliary terminal 273. A capacitor 276 is connected in parallel with the resistor 274. The emitter of the transistor 270 is coupled to ground through a capacitor 278, and connected to the third voltage supply 238 through a resistor 280. The collector of the transistor 270 is connected to a resistor 282, the remaining terminal of which is connected to both the base of a transistor 284 and a resistor 286. The remaining terminal of the resistor 286 is connected to the cathode of a zener diode 288 (such as zener diode IN752), the anode of which is connected to ground.

The emitter of the transistor 284 is connected to the junction of the resistor 286 and the cathode of the zener diode 288. The emitter of the transistor 284 is also connected to ground through a coupling capacitor 290, and is connected to the second voltage supply 222 through a resistor 292. The collector of the transistor 284 is connected to the third voltage supply 238 through a pair a series-connected resistors 294 and 296. The cathode of a diode 298 is connected to the junction of the resistors 294 and 296, the anode of the diode 298 being connected to ground. The output of the sync pulse circuit is taken at the junction of the resistors 294 and 296 and the cathode of the diode 298, at line 300.

Those skilled in the art will recognize that the transistors 260 and 284, together with the associated components, form a "stripper" circuit which eliminates the data, such as video information, from the stored signal and leaves for the output only a timing signal, or sync pulse. In some applications such a separate timing track may be desired. In many applications, however, such as conventional video playback, no separate timing track is required and in fact the timing signal can be derived from any monitored photodiode. In such situations the output of the amplifier associated with the monitored photodiode is fed into the stripper circuit described above, specifically, the output is connected through the filter circuit (comprising resistor 274 and capacitor 276) to the base of the transistor 270. A suitable timing pulse is then produced on output line 300.

The timing pulse provided on line 300 may be utilized in a variety of applications. In one application, particularly suitable for electronic games and multiple displays, the timing signal 300 is applied to a quadrant select circuit as illustrated in FIG. 3b. More specifically, the sync pulse appearing on line 300 provides an input to a retriggerable one-shot 302, configured to provide a nominal 50 microsecond pulse on the outputs thereof. The actual pulse width of the output of the one-shot 302 is adjustable by means of a variable resistor 303 connected to the otherwise conventional pulsewidth selection circuitry.

The complement output of the one-shot 302 provides an input to a second one-shot 304, while the "true" output of the one-shot 302 provides an input to a third one-shot 306. The one-shot 304 is configured to provide a nominal 200 microsecond pulse, with adjustment provided by a variable resistor 305 connected similarly to variable resistor 303. Similarly, one-shot 306 is configured to provide a nominal 30 microsecond pulse with adjustment provided by variable resistor 307.

The true output of the one-shot 304 provides an input to a fourth one-shot 308, the pulse width of which is adjustable in a manner similar to that described above by means of a variable resistor 309. The one-shot 308 is configured to provide nominally a six microsecond pulse. The true and complement outputs of the one-shot 306 are connected to the set and reset inputs, respectively, of a buffer flip-flop 310, the clock input thereof being tied low and the data input of which is connected to the complement output thereof.

Those skilled in the art will recognize that the pulse widths of the flip-flop 310 and the one-shot 308 are of approximately one-half the duration of a video frame and a video line, respectively. Thus, the outputs of the flip-flop 310 and the one-shot 308 are suitable for controlling a decode circuit which divides a video frame into quadrants—i.e., devices the frame into halves both vertically and horizontally. Such a decode is shown in FIG. 3b and comprises four two-input nand gates 312, 314, 316 and 318. The true output of the flip-flop 310 provides one input to each of nand gates 312 and 314, while the complement output of the flip-flop 310 provides an input to nand gates 316 and 318. The true output of the one-shot 308 provides the remaining inputs to the nand gates 312 and 316, while the complement output thereof supplies the remaining input to the nand gates 314 and 318.

The outputs of the nand gates 312, 314, 316 and 318 control a switch array 320, which may, for example, be a Siliconix DG-172. Each nand gate controls a separate solid state switch of the switch array 320, and when activated connects a current source 321 to an associated preamplifier as shown in FIG. 3c by means of output lines 322, 324, 326 and 328. As will be discussed in greater detail hereinafter, activation of a switch in the switch array 320 selects for monitoring a photodiode and preamplifier. Consequently, selective closure of the switches in switch array 320 determines what data (imaged from the disc onto the photodiodes) will be displayed. More particularly, if video data is being retrieved, the quadrant select circuitry and decoder shown in FIG. 3b permit a different picture to be displayed in each quadrant of the display device.

As noted previously, for many applications the quadrant select circuitry shown above will be unnecessary. For such applications, the select circuitry described above may be eliminated. Instead, the decoder associated therewith may be simply replaced with a register for driving the switch array 320, as will be discussed in greater detail in connection with FIGS. 5a–5c.

Returning to FIG. 3c, there is shown therein detailed circuitry for an exemplary portion of the photodiode, preamplifier and amplifier circuitry as shown generally in FIG. 2. It will be noted that the circuitry associated with each of the four photodiodes shown is analogous to that discussed above (FIG. 3a) in connection with the sync pulse circuit.

More specifically, an avalanching photodiode 336 (part of the photosensitive array 14 of FIG. 1) is shown continuously biased by having the anode thereof connected to ground through a resistor 338 and the cathode thereof connected to the voltage supply 209 (typically 200 V.) through a resistor-capacitor network comprising capacitor 340, resistors 342 and 344, a variable resistor 346. The capacitor 340 and the resistor 342 are each connected to the cathode of the photodiode 336, with the remote terminal of the capacitor 340 being tied to ground. The remaining terminal of the resistor 342 is connected to the junction of resistor 344 and variable resistor 346. The remaining terminal of resistor 344 is grounded, while the remote terminal of resistor 346 is tied to high voltage supply 209. Thus it can be seen that photodiode 336 is maintained in a continuously active state, and therefore produces electrical signals responsive to the data imaged thereupon.

The signals produced by the photodiode 336 are sensed and amplified by a differential pair of transistors 334a–b, the anode of the photodiode 336 being connected to the base of the transistor 334a. The transistors 334a–b and associated electronics provide a current sensing preamplifier. The emitters of each of the transistors 334a–b are connected to resistors 332a–b, respectively, the remote terminals of which are connected together. The junction of the resistors 332a–b is connected to ground through a resistor 330, but is also connected to a switch of the switch array 320 (FIG. 1). The base of the transistor 334b is connected to a parallel connection of a resistor 350 and capacitor 352, which are in turn connected to ground through another resistor 354.

It can be seen that the preamplifier and associated photodiode may be selected for monitoring or activating the appropriate switch in array 320 to connect line 322 to current source 321. In addition, however, the resistor 330 provides a current path which maintains the preamplifier biasing when the preamplifier is not monitoring. This minimizes the delay time between selection of the preamplifier for monitoring and obtaining usable data therefrom. The value of the resistor 330 may be adjusted to ensure that signals from non-selected preamplifiers do not interfere with signals from selected preamplifiers.

As can be further seen from FIG. 3c, a plurality of photodiodes 356, 358 and 360 are each connected to a separate preamplifier identical in construction to that described above, and will not be described in detail. It should be noted, however, that the preamplifiers may be integrated into the monolithic array of photodiodes. Each of the preamplifiers shown is connected at its outputs to a single pair of busses 362 and 364. For example, the collectors of the differential pair of transistors 334a and 334b are connected to the busses 362 and 364, respectively. While only four photodiodes and associated preamplifiers are shown connected to the busses 362 and 364, it will become clear in connection with FIG. 4 that the number of preamplifiers connected to the busses 362 and 364 will equal one-fourth the number of photodiode elements in each row of the photosensitive array as shown in FIG. 1b. It should be clear that, since only a single element will be monitored at any time for most applications, only one of the plurality of preamplifiers connected to busses 362 and 364 will be selected at a given time, via busses 322, 324, 326 and so on up to 328.

The busses 362 and 364 provide inputs to another differential pair of transistors 366a and 366b by being connected to the emitters thereof, respectively. The transistors 366a–b are biased in a conventional manner, with the bases of the transistors 366a–b each being connected to a pair of resistors 368a–b, respectively, and a pair of capacitors 370a–b, respectively. The remote terminals of the capacitors 370a–b are tied to ground. The remaining terminals of the resistors 368a–b form a junction which is connected to ground through a resistor 372 and connected to the voltage supply 238 through a resistor 374.

The connectors of the differential pair 366a–b are also conventionally biased and are connected to resistors 376a–b, respectively. Similar to the resistors 368a–b, above, the resistors 376a–b form a junction which is connected to ground through a capacitor 378 and is connected to the voltage supply 238 through a resistor 380. The outputs of the stage are taken from the connectors of the transistors 366a–b, and feed an amplifier stage by being connected to the bases of a differential transistor pair 382a–b.

The amplifier stage, of which transistors 382a–b comprise a part, employs conventional biasing. The collectors of the transistors 382a–b are each coupled to ground through a pair of capacitors 384a–b, respectively, and connected to the voltage supply 238 through a pair of resistors 386a–b, respectively. The emitters of the transistors 382a–b, from which the outputs of the stage are taken, are connected to the voltage supply 222 through resistors 388a–b respectively. The outputs of the stage provide inputs to a differential emplifier 390 through coupling capacitors 392a–b, respectively. The inputs to the differential amplifier 390 are each tied to ground through resistors 394a–b, respectively. The differential amplifier 390 is of a conventional type and may, for example, be a Motorola 1445 amplifier.

The output of the differential amplifier 390 provides an input to the base of a transistor 396, which forms part of an emitter follower stage. The collector of the transistor 396 is connected to the voltage supply 238 through a resistor 398, and to ground through a capacitor 400. The emitter of the transistor 396 is connected to a resistor 402, the remaining terminal of which is connected to ground through a capacitor 408, and connected to the voltage supply 222 through a resistor 406. The output of the stage is taken at line 410, which is connected to the emitter of the transistor 396 through a resistor 404. The signal at line 410 is suitable for use with conventional video displays or other data retrieval devices.

From the above it can be seen that the circuitry shown in FIGS. 3a–3c is suitable for retrieving data from a track of information as stored on an optically sensitized disc. As noted previously, in many applications the separate timing track photodiode and preamplifier shown in FIG. 3a is unnecessary. In such applications, the timing signal may be derived from the signal at line 410, by applying the signal at line 410 (FIG. 3c) to the junction of resistor 272 with resistor 274 and capacitor 276 (FIG. 3a); i.e., the terminal 273. The ease with which this substitution may be accomplished will be apparent from the essential similarity between the preamplifier and amplifier stages associated with photodiode 200, and those associated with photodiodes 336, 356, 358 and 360.

Figure 4:
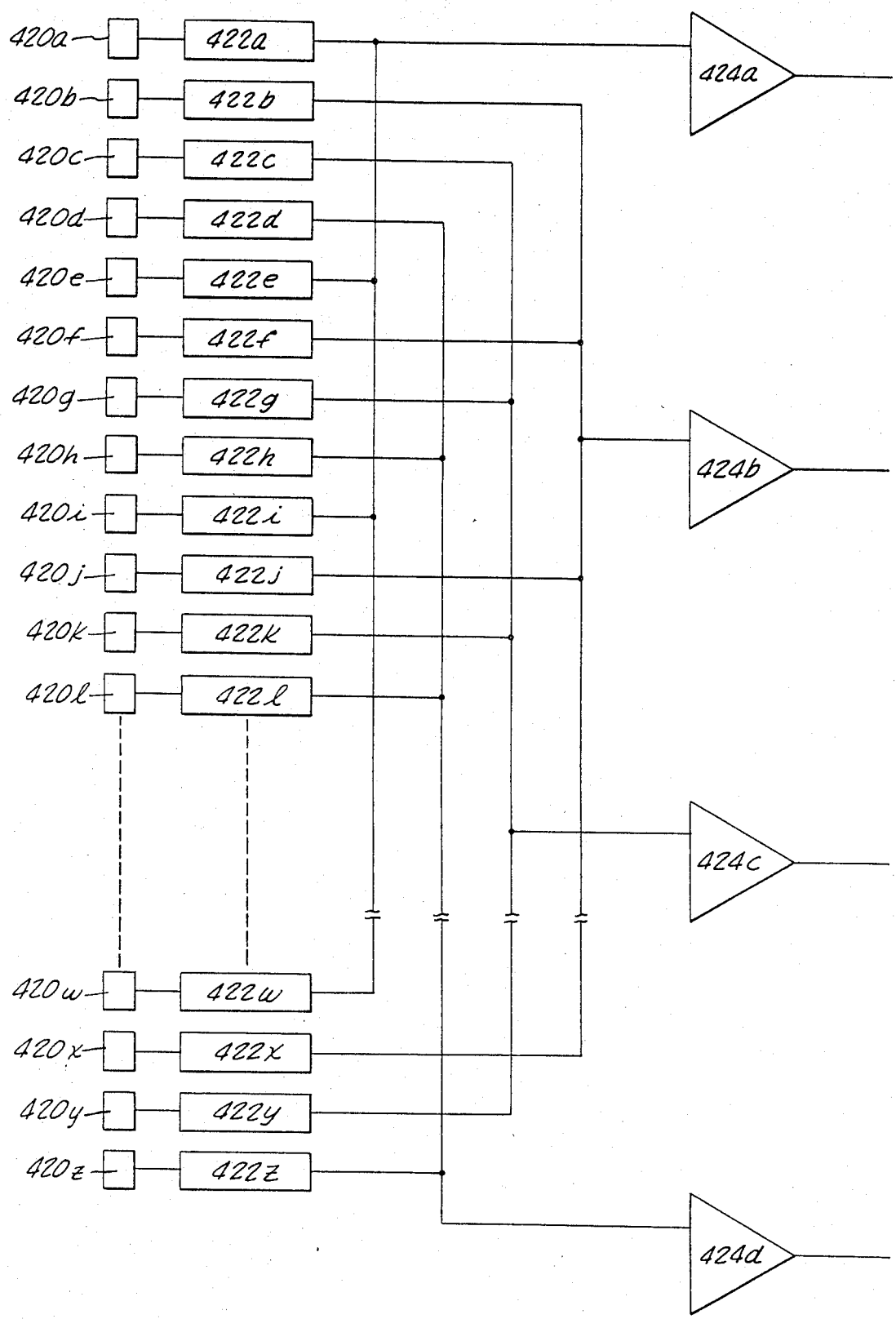
FIG. 4 illustrates in block diagram form the relationship between individual elements of the photosensitive array and the preamplifiers and amplifiers of a preferred embodiment of the present invention.

Attention is now directed to FIG. 4, which schematically illustrates the interconnection of each of the photodiodes in the photosensitive array 14 shown in FIGS. 1a–b (and associated preamplifiers) with the amplifier stages. As noted in connection with FIGS. 3a–3c, each photodiode has associated therewith a preamplifier, but a plurality of preamplifiers are connected to a single amplifier. As shown in FIG. 4, a preferred embodiment of the invention employs four amplifiers per row of elements in the array which requires that each amplifier be connected to one-fourth of the elements in a row of the array. Thus, if each row of the array comprises 256 photosensitive elements, sixty-four photodiodes are associated with each amplifier.

The use of four amplifiers per row of photosensitive elements is to some extent an arbitrary choice, and a different number of amplifiers may be used with substantially the same results. However, it has been discovered that track position on the disc may vary (due to miscentering and other defects) such that, with the selected size of the elements in the array, and the selected amount of magnification used in imaging the data track onto the elements, the position of the data track image on the array will vary as far as four elements. Since only one photodiode actively supplies information to its associated amplifier at a given time, it is necessary to have four amplifiers so that four photodiode elements may be actively monitored. Obviously, many variations of this configuration could be employed without departing from the invention.

Since the four photodiodes selected for monitoring are preferably adjacent in the row of the array, the arrangement shown in FIG. 4 has been found desirable. A row of photodiodes 420a–z, perhaps comprising 256 or more elements, is shown with the associated preamplifiers 422a–z, respectively. The first preamplifier 422a is then connected to an amplifier 424a. It is to be understood that preamplifiers 422 and amplifiers 424 are of the sort shown in FIGS. 3a–3c. The second preamplifier 422b feeds a second amplifier 424b, the third preamplifier 422c feeds amplifier 424c and the fourth preamplifier 422d feeds amplifier 424d. The connections then repeat in groups of four, so that amplifier 424a is connected to preamplifiers 420 a, e, i, m and so on (first, fifth, ninth, thirteenth). Amplifier 424b is connected to the second, sixth, tenth, etc., preamplifiers, amplifier 424c is connected to third, seventh, eleventh preamplifiers, and amplifier 424d is connected to fourth, eighth, twelfth and so on. Obviously, the system can be expanded to include any desired number of elements, and could include more than a single row of the array.

As noted previously, the portion of the data track image on the array varies as a result of miscentering or other errors during production. In addition, readout of the entire disc requires movement of the relative positions of disc and array. In each instance the data track image may move out of alignment with the monitored portion of the array. While relatively instantaneous excursions have been found not to exceed four elements, more slowly varying excursions may exceed that area scanned by the group of four elements. In such a case the four elements being monitored must be re-selected to ensure that relatively instantaneous variations do not exceed the selected four elements.

Figure 5B:
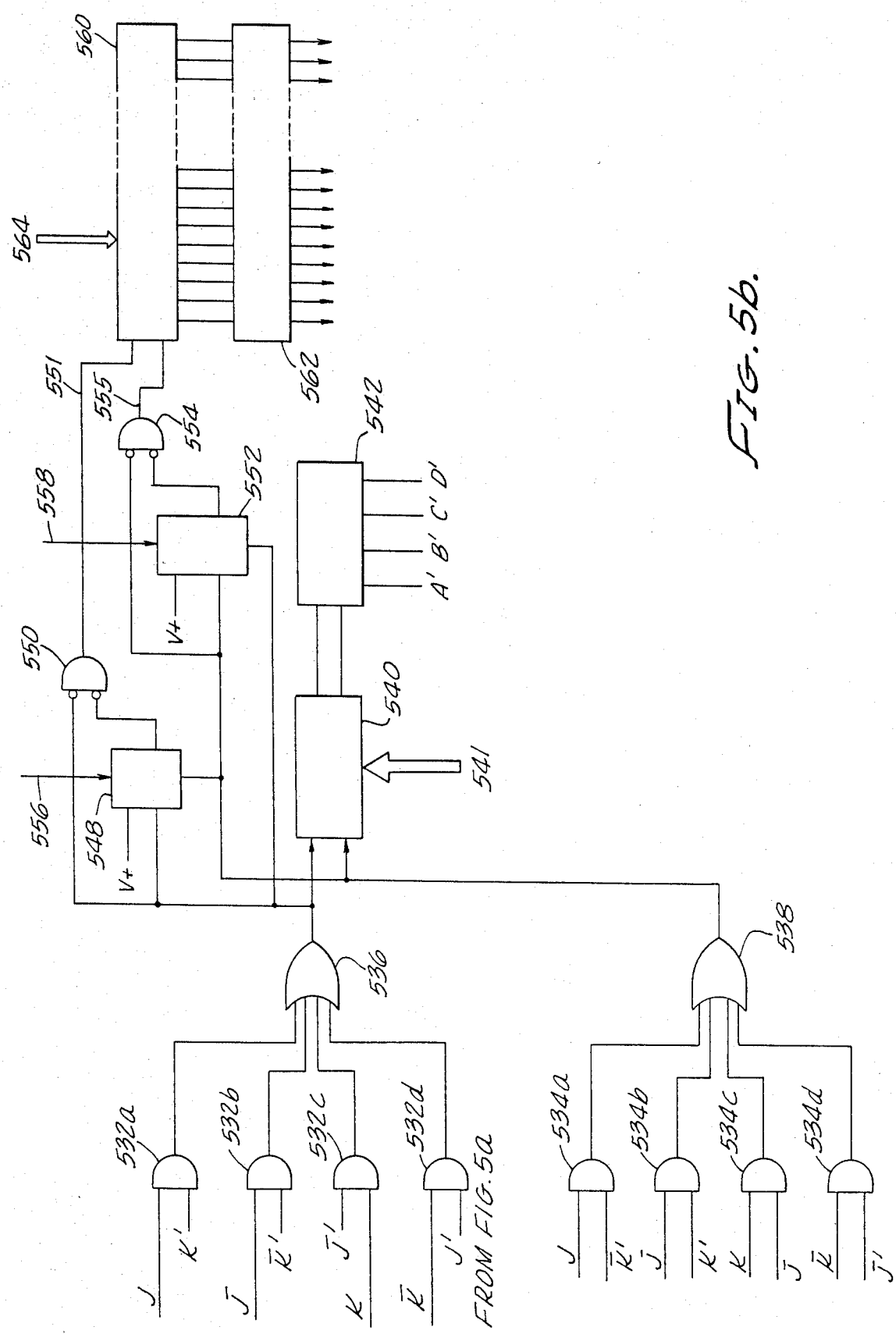

Curcuitry for detecting variations in track position, and re-selecting the group of four monitored elements, is shown in FIGS. 5a–5b. In FIG. 5a, the amplifiers 424a–d are shown providing signals to analog switches 500a–d, respectively, and also providing signals to average level detector circuits 504a–d, respectively. Each average level detector is designed to monitor the output of the associated diode, and comprises a transistor 506 used in an emitter follower configuration. The collector of the transistor 506 is connected to a suitable voltage supply through a resistor 510. The emitter of the transistor 506 is connected to ground through a biasing resistor 508, and provides an output signal through a resistor $R_c$ and a diode 512.

The current through the resistor $R_c$ charges a capacitor $C_a$ to the signal at the associated photodiode. The capacitor $C_a$ is then allowed to discharge through a resistor $R_d$ where $R_d$ is much larger in value than $R_c$. The charge on the capacitor $C_a$ is sensed by a high gain amplifier 514, such as the 741 operational amplifier, which provides an input signal to a comparator 516a. Similarly, the level detector 504c provides the reference signal to the comparator 516a. The level detector 504b provides one signal to a comparator 516b, with the level detector 504d providing the reference signal thereto. The outputs of the comparators 516a–b, or J and K respectively, will thus reflect which of the level detectors 504a–c and 504b–d provide the greater signals.

The signals J and K are then operated upon by leading and trailing edge detector circuits 518a and 518b, respectively, to additionally provide signals J, J', J̄', K̄, K' and K̄'. The J line provides the input to the circuit 518a, and provides one input to an "and" gate 520, and an inverter 524. The J line also provides an input to an "and" gate 522 through a resistor $R_2$ which input is also coupled to ground through a capacitor $C_2$. The remaining input to the and gate 522 is provided by the inverter 524, or J̄ line. The J̄ line also provides the remaining input to the "and" gate 520 through a resistor $R_1$, which input is coupled to ground through a capacitor $C_1$. The output of the "and" gate 520 provides the signal J', while the output of the "and" gate 522 provides the signal J̄'.

The edge detector circuit 518b is similar in configuration to the circuit 518a. A signal K̄ is derived from the output of an inverter 528 fed by the K line. The signal K' is provided by the output of an "and" gate 526, one input of which is the K signal and the remaining input of which is the signal K̄ fed through a resistor $R_3$ and coupled to ground through a capacitor $C_3$. The output signal K̄' is provided by the output of an "and" gate 530, one input of which is the K̄ line and the remaining input to which is the K line fed through a resistor $R_4$ and coupled to ground through a capacitor $C_4$. It will be apparent that the RC networks in circuits 518a–b provide a time delay resulting in a short pulse on the associated output lines. More specifically, the J', J̄', K' and K̄' outputs provide pulses at the leading and trailing edges of the J, J̄, K and K̄ pulses, respectively.

Depending upon the order in which the J', J̄' or K', K̄' pulses occur, the direction in which the data track is moving relative to the array may be determined. For example, let it be assumed that the circuit is configured such that the movement of the data track image across the array (as in FIG. 1b) causes a pulse to occur on K' before it occurs on K̄'. Then, for movement of the track in the opposite direction, a pulse occurs first on K̄', then of K'. Based on this knowledge, simple detection of the order in which the pulses occur permits determination of direction of movement across the group of four elements in the array being monitored. This information, together with knowledge of which element in the group of four was previously used to provide the video output signal (through analog switches 500a–d), makes it possible to follow the data track in its excursions across not only the group of four, but also across the entire array.

Referring to FIG. 5b, there is shown therein circuitry for accomplishing the above stated objective. The signals J and K' provide inputs to "and" gate 532a, the output of which feeds one input of an "or" gate 536. Similarly, signals $\bar{J}$ and $\bar{K}'$ feed an "and" gate 532b, which in turn feeds another input of "or" gate 536. Signals $\bar{J}'$ and K feed "and" gate 532c, which in turn feeds "or" gate 536, while the signals $\bar{K}$ and J' feed "and" gate 532d which supplies the last remaining input to "or" gate 536. The "or" gate 536 provides an "up" count, or a count in a first direction, to two bit up-down counter 540, the clock input of flip-flop 548, "nor" gate 550 and the rest line of flip-flop 552, the purposes of which will become clear hereinafter. The complement output of the flip-flop 548 provides the remaining input to the "nor" gate 550.

A "down" count, or count in a second direction, is provided by an "or" gate 538, which is fed by a series of "and" gates 534a–d. The inputs to the "and" gate 534a are provided by signal J and $\bar{K}'$; inputs to the "and" gate 534b are provided by signals $\bar{J}$ and K'. Similarly, inputs to "and" gate 534c are provided by signals K and $\bar{J}$, while inputs to the "and" gate 534d are provided by signals $\bar{K}$ and $\bar{J}'$. The "down" count provided by the "or" gate 538 is supplied to up-down counter 540, the reset line of flip-flop 548, the clock input of flip-flop 552 and one input of "nor" gate 554.

The "or" gate 538 provides a "down" count signal to the reset input of flip-flop 548, the up-down counter 540, the clock input of the flip-flop 552, and one input of a "nor" gate 554. The complement output of the flip-flop 552 provides the remaining signal to "nor" gate 554. The "nor" gates 550 and 554 provide bi-directional shift signals to an N-bit register 560, where N is the number of elements in one row of the photosensitive array. The register 560 may be of any conventional type having parallel in, parallel out data access together with bi-directional shifting. Four data bits in the register 560 are initially driven active by initialize lines 564, preferably controlled by a microprocessor or other sequencing means. These four active bits control four switches in an analog switch array 562 such as the Siliconix DG 172, which may be substituted for switch array 320 and the associated quadrant selection circuitry shown in FIG. 3b, and thus initially select four elements for monitoring.

The up-down counter 540 supplies a two data bit code to a decoder 542. Depending upon the state of the counter, 540, one of four outputs of the decoder 542 (A', B' C' or D') is driven active. The outputs A', B', C' and D' are connected to the analog switches 500a–d, respectively, and thus control which amplifier output (i.e., output signal) is provided at output bus 546 (FIG. 5a). Keeping in mind that the amplifiers 424a–d are responsive to signals from the selected group of four photodiodes, it can be seen that the state of the counter 540 determines which element in the group of four actually provides the signal for display. Further, since the state of the counter is controlled by comparators (FIG. 5a) sensing the relative strengths of each element within the group of four, it can be seen that this strongest signal is the one selected for ultimate display. Initialize lines 541 are provided on the counter 540 to initially select one element of the group of four for ultimate display at bus 546.

To allow for the most rapid compensation for relatively instantaneous variations in data track position, the element of the group of four selected for ultimate data display is preferably one of the two inner elements in the group of four. In the event of a shift in data track position, the element selected for display follows the strongest data track image. If the image should require an end element in the group of four to be selected for display, the remaining circuitry in FIG. 5b causes the group of four to be reselected so that the element selected for display is an inner element of the group of four.

The above selection of the group of four selected photodiodes is accomplished in the following manner. As previously described, the comparators 516a–b control, through combinational logic, the "or" gates 536 and 538. The "or" gates 536 and 538 in turn control not only the counter 540 but also flip-flops 548 and 552 and one input to each of "nor" gates 550 and 554. The flip-flops 548 and 552 will be recognized as binary counters, such that an input signal is provided only for every two counts (depending upon the initialized states). Since a clock signal appears at the flip-flops 548 and 552 only when the data track image moves from one photodiode to the next, two clock signals mean that the image has moved twice. Because of the reset lines on the flip-flops 548 and 552, the two clock signals must indicate movement of the data track image in the same direction before a count signal appears at the outputs of either of flip-flops 548 and 552.

When a count signal appears at the output of flip-flop 548, a shift signal likewise appears at the output of "nor" gate 550, causing the data in register 560 to be shifted one place in a first direction. Since the four active data bits of register 560 control, through switch array 562, which photosensitive elements are monitored, the flip-flop 552 operates analogously to provide a shift in the opposite direction.

Those skilled in the art will recognize that selective use of the initialize lines 556 and 558, for flip-flops 548 and 552 respectively, will cause appropriate shift signals to be applied to the register 560 so that three of the four monitored photodiodes will be positioned around the diode actually being used for data retrieval. It will be remembered that such an arrangement is preferred, to ensure accurate data track following despite relatively instantaneous excursions.

The above describes circuitry for electronically monitoring the position of a data track, and optoelectronically retrieving data therefrom. It should be understood that the switching associated with reselecting the group of four monitored elements, or reselecting the output for data retrieval, may, for video information, be accomplished within the horizontal retrace interval to avoid disturbing the displayed data. However, while switching during non-data intervals is preferred, the switching may be arranged to occur at any desired point in the retrieval sequence.

With some modification, the circuitry shown in FIGS. 3a–c, 4 and 5a–b is suitable for retrieval of data in either the parallel sequential or parallel simultaneous readout modes. As noted previously, parallel sequential readout involves sampling a portion of the data from a first track (or one portion of a continuous spiral track), then rapidly switching to another track and sampling the data contained therein, switching again, and so on.

With the present invention, the data tracks may be sampled in any desired order.

To operate the present invention in the parallel sequential readout mode, a group of four photodiodes is selected through the use of initialize lines 564 (controlled by a microprocessor, not shown, or other suitable selection means) to activate the appropriate positions in the register 560. When the desired amount of information has been retrieved from this first data track, the microprocessor or other selection means then operates through the initialize lines 564 to reselect the group of four monitored photodiodes so that information may be retrieved from a second data track. The above process is repeated until the desired amount of information has been retrieved. Of course, the circuitry described in connection with FIGS. 5a-b is still operable to ensure that the group of four monitored photodiodes is appropriately positioned around the strongest data signal. This method of readout is especially suited to message scrambling and a variety of games.

As noted previously, parallel simultaneous readout involves reading data from a plurality of parallel tracks or parallel portions of a single continuous spiral track. To operate the present invention in a parallel simultaneous readout mode, initialize lines 564 are controlled to place in an active state a plurality of data bits of the register 560, there preferably being four active data bits for each selected track. For example, if it is desired that four data tracks be simultaneously read out, four groups of four register bits each will be placed in an active state. Naturally the groups may be anywhere in the array.

Since the tracks may be selected in any arbitrary manner, the arrangement shown in FIG. 4 for connecting the photosensitive elements to the amplifiers is not sufficient. Rather, the circuitry of FIG. 4 must be modified to include an amplifier for each photosensitive element. The remaining circuitry will therefore be modified in a manner deemed apparent to those skilled in the art based on the teachings herein.

With some modification, the system described above can provide compensation for lost data, specifically video data. While such an option is not required for most applications, it may occasionally occur that debris on the disc, or scratches therein, may obscure the data such that an incorrect signal is provided to the photosensitive array. In terms of a video display, a loss of such information would appear as a loss of part of a television line. Since video data is typically highly redundant, the rapid switching capability of the present invention permits switching from the data track which has been obscured to an adjacent data track whereon the data is unobscured.

Figure 6:
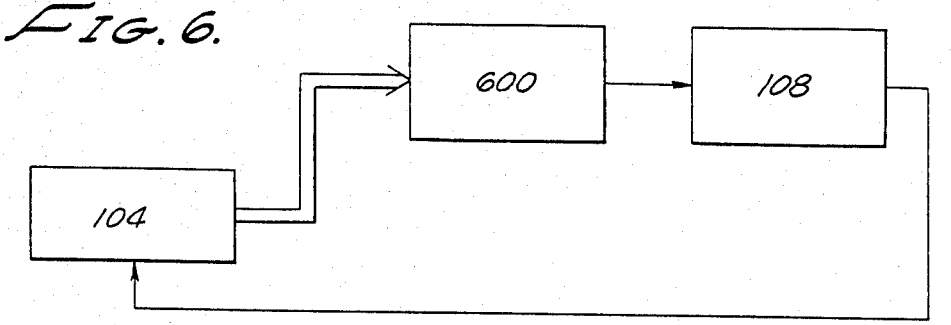
FIG. 6 illustrates, as a functional block diagram, circuitry for providing data dropout compensation.

To operate the circuitry shown in FIGS. 3a-c, 4a-b and 5a-b and 5a-b in this manner, the above described circuitry should be modified to include any of a number of suitable signal detection circuits known to those skilled in the art, as shown in FIG. 6. The signal detection circuit 600 will detect the loss of a video signal and in response thereto cause the switching circuit 108 (FIG. 2) to reposition the active data bits within the register 560 to monitor the adjacent track. This may, for example, be accomplished through the initialize lines 564 associated with the register 560. Should the data contained within this track also be obstructed, a second switching to the next data track may be performed. The switching circuit 108 would then provide signals to the preamplifier circuitry 104 described in connection with FIG. 2. The signal detection circuit 600 should also include register and counter means, not shown, for recognizing the number of tracks wherein data has been obscured, so that readout from the first adjacent track having retrievable information will be repeated once for each obscured data track. In this manner, drop-out of limited quantities of video or other redundant information may be compensated.

Figure 7:
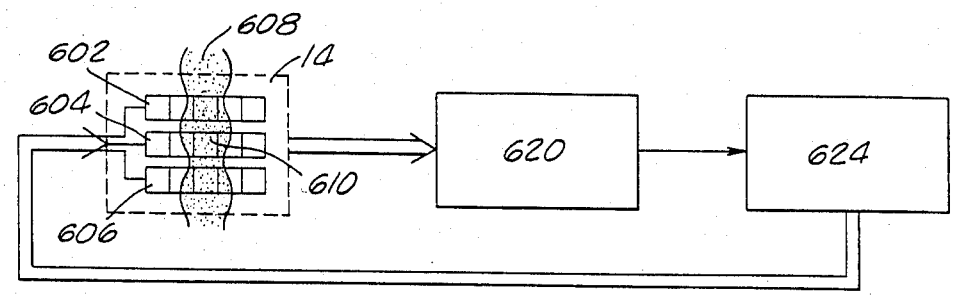
FIG. 7 illustrates, in block diagram form, circuitry for providing time base correction.

With some modification, the present invention may also provide time base correction; that is, compensation for fluctuations in rotation of velocity of the data disc. Reference is made to FIG. 7, which illustrates circuitry for detecting fluctuations in rotational velocity, and for compensating therefor. A portion of the photosensitive array 14 is shown, organized into three rows 602, 604 and 606 of five elements each. As will be recalled from FIG. 1b, the data track images pass over the array in a direction perpendicular to the rows 602, 604 and 606, as illustrated by data track image 608. With a variation in disc velocity, a given point in the image 608, for example, data bit 610, will arrive at the second row of the photosensitive elements 604 either early or late, relative to the ideal rotational velocity of the disc.

In such an event, the data bit 610 will then impinge on another of the rows, for example 602 or 606, of photosensitive elements at the expected time. For example, if the direction of data track movement in FIG. 7 is from top to bottom, and there is an increase in rotational velocity, the data bit 610 may reach the row 606 at the time it should ideally reach the row 604. By recognizing that the data bit 610 is arriving early at the preferred row 604, it is possible to employ the rapid switching techniques of the present invention to monitor the row 606 instead of row 604.

To operate the present invention in this manner, the circuitry shown in FIGS. 3-5 is modified to include velocity detector 620 as shown in FIG. 7 for monitoring rotation rates of the data disc. The velocity detector 620 may comprise a digital comparator which compares the occurrence of a synchronized master time signal generated by an external clock with the signal (for example, the horizontal sync pulse) from the data track itself. Since each row of photosensitive elements in the array 14 is amplified independently of the remaining rows, it is necessary to further include a conventional switching means 624 to cause a second row (either 602 or 606) to be monitored instead of the normally monitored row of photosensitive elements (604). In some instances it may be desirable to continuously monitor a plurality of rows.

Applying the above to the example given, wherein the data disc is rotating too rapidly, the velocity detector 620 would recognize that the data track 608 was rotating a specified amount more rapidly than normal, and signal the switching circuitry 624 to discontinue monitoring of the row 604 and instead begin monitoring the row 606. In this manner, the fluctuations in rotation of velocity may be compensated. Obviously, a decrease in rotation of velocity would cause the row of elements in the array 14 preceding the normally sampled row to be monitored. It should be understood by now that the specific elements being monitored in each row will be determined as discussed in connection with FIGS. 3, 4 and 5.

Figure 8:
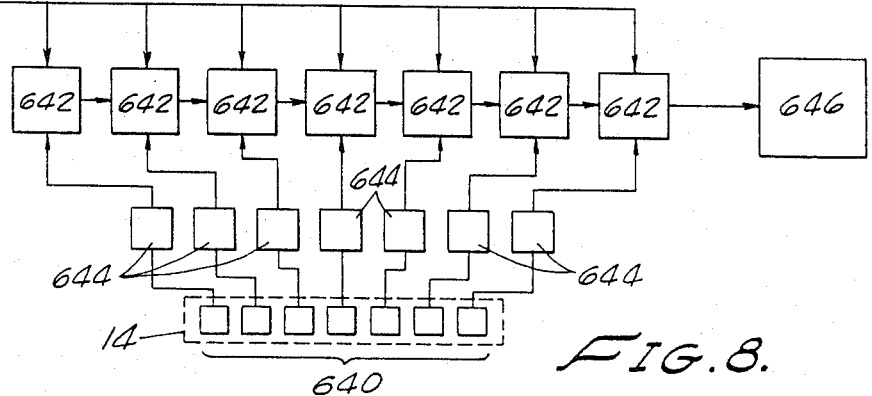
FIG. 8 illustrates circuitry for improving the signal-to-noise ratio of the data being retrieved by the present invention.

Another aspect of the present invention is the capability of providing an improved signal-to-noise ratio of the data retrieved from the rotating disc. Referring to FIG. 8, which illustrates in part one column of elements 640 taken from the array 14; the column 640 may be thought of as one element from each of a plurality of rows. Assuming the direction of data movement to be from left to right, it can be seen that a data track image passes over all of the elements in the column 640. Since each row of elements, and therefore each element in the column 640, is associated with separate and independent amplifiers, it is possible to monitor the data signal from each element in the column. Since most "white noise" present in a data track image of the nature described herein results from fluctuations in intensity of the flooding light source used to illuminate the data disc, the signals from each element in the column 640 may be summed to provide a signal-to-noise improvement related to the square root of the number of elements in the column.

However, the subject data presents at different times at each of the elements in the column 640. Since the desired, enhanced signal results only from the sum of properly synchronized signals, it is necessary to delay the signal provided by the earlier photosensitive elements so that they coincide in time with the signal provided by the last photosensitive element in the column 640. For this purpose, an electrically variable delay line 642 may be connected to the outputs of the preamplifiers 644 associated with each of the photodiodes in the column 640. The delay time for each delay line 642 may preferably be electrically varied to compensate for the variation in data densities between the inside diameter of the stored information, and the outside diameter of the stored information. It should be remembered that one video frame, or other bloc of stored information, is contained in one rotation of the data disc, regardless of the distance of that information from the center of the disc. Therefore, information stored in a data track close to the center of the disc is stored at greater density than information stored in a data track at the outside of the disc. Since the interelement spacing in the photosensitive array is fixed, a data bit toward the center of the disc will take longer to rotate past the column of elements than a data bit at the outside of the disc (because of the different angles through which a data bit on the disc must travel to rotate past a fixed number of elements). As a result, the times for the delay line 644 must be varied in accordance with the location of the data on the disc. The signals from the plurality of photosensitive elements, after being delayed by the delay lines associated therewith, are summed in a conventional manner by summing circuit 646 and supplied to preamplifier circuitry as shown in FIGS. 3a–c. It should be recognized that for most data retrieval purposes, improvement in signal-to-noise ratio is unnecessary. However, such procedures are valuable in detecting digital high density digital information.

Figure 9:
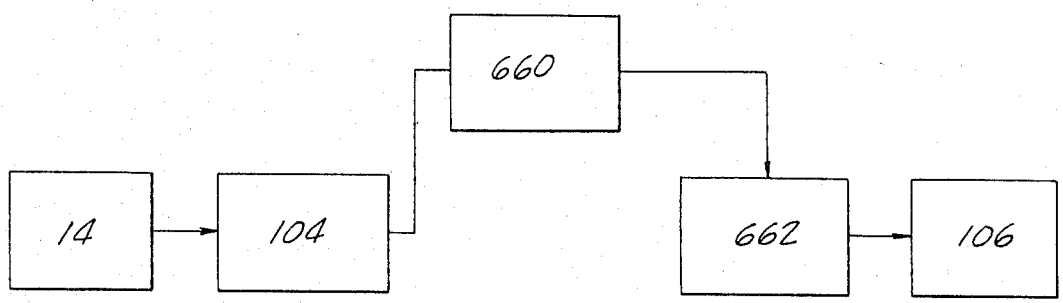
FIG. 9 schematically illustrates circuitry for enchancing the frequency response of a data retrieval system.

Another aspect of the present invention is the capability of providing improved frequency response. As previously discussed, roundoff of the horizontal sync pulse results in some degradation of the high frequency signals such as the 3.58 megahertz color burst signal in video color recording. Using the circuitry shown in FIG. 9, the frequency response of the signal provided by the preamplifiers 104 (FIG. 2) may be enhanced by passing the output thereof through a circuit 660. In response to the signal produced by the differentiator circuit 660, a frequency emphasis network 662 may be activated. It should be understood that a specified amount of roundoff requires all signals greater than a related frequency to be emphasized. The frequency emphasis circuit 662 comprises a plurality of high frequency band pass filters such as active filters for amplifying the high frequency components of the data signal such as 2 megahertz and 3.58 megahertz. Together with the unemphasized components of the data signal, the now-enhanced remaining portion of the frequency components are supplied by the frequency emphasis circuit 662 to the amplifier circuitry 106 (FIG. 2). The remainder of the data retrieval system will remain as described above. It can be seen that this emphasis circuit will provide an improved frequency response, enhancing primarily the high frequency black and white and color video signals. Again, it should be noted that most video applications will not require a circuit having this complexity. However, it is to be anticipated that other forms of data retrieval, as well as high density video packing may require such techniques.

From the foregoing it can be appreciated that an improved system for data retrieval has been described, including different aspects thereof permitting improved data track following, data readout, parallel sequential and parallel simultaneous readout, time base correction, dropout compensation, improved signal-to-noise ratio, and frequency response enhancement. It is to be understood that the particular embodiments disclosed are exemplary only and numerous variations which do not depart from the spirit of the present invention will occur to those normally skilled in the art. It is intended that these obvious variations and equivalents be included in the scope of the present invention.

We claim:

1. An electro-optical data retrieval system for retrieving data from a storage medium and of the type wherein relative motion is imparted between the recording medium and pickup means for causing said data to be scanned for retrieval thereof, comprising:

means for receiving a data-bearing storage medium having a relatively high density of data tracks thereon, illuminance means for illuminating an area of said storage medium, detector means including a matrix array of photosensitive elements, said array having predetermined dimensions, focusing means for focusing an image of an area of interest within said illuminate area of said storage medium onto said detector means, the image of a data track being no smaller than a single photosensitive element, said array being dimensioned such that the area of interest does not extend beyond said array despite variations in the position of the area of interest with respect to the array due to variations in the location of the data relative to the detector means, select circuit means including means for selecting at least one of said photosensitive elements of said array to provide an output signal of the system, said means for selecting including register means for selecting at least one of said photosensitive elements, velocity detection means including external clock means responsive to signals from at least one of said photosensitive elements for determining increases and decreases in the rotational velocity of said storage medium, and switching means responsive to said velocity detection means for selecting from said photosensitive elements at least one of said elements positioned so that the information to be retrieved is present at that element at the proper time as determined by said velocity detection means.

2. The electro-optical data retrieval system of claim 1 further comprising amplification means for amplifying signals produced by a plurality of elements of said photosensitive array, and said select circuit means provides an output signal of the system.

3. The electro-optical data retrieval system of claim 2 wherein said amplification means includes an amplifier for current-sensing.

4. The electro-optical data retrieval system of claim 2 wherein said amplification means includes preamplifier means associated with each of said elements of said photosensitive array, and said select circuit means having means to select at least one preamplifier means to provide the output signal of the system.

5. The electro-optical data retrieval system of claim 2 wherein said amplification means is responsive to the select circuit means and includes preamplifiers and means for maintaining said preamplifiers in a standby state except when selected by said select circuit means.

6. The electro-optical data retrieval system of claim 5 wherein said register means is provided for selecting a plurality of preamplifiers.

7. The electro-optical data retrieval system of claim 6 wherein said register means causes said plurality of said preamplifier means to supply signals to a plurality of said amplifier means, and said select circuit means further includes comparison means for selecting at least one of said amplifier means to provide said output signal.

8. The electro-optical data retrieval system of claim 7 wherein said register means selects four preamplifiers, and said amplifier means comprises four amplifiers, each of said preamplifiers providing a signal to one of said amplifiers.

9. The electro-optical data retrieval system of claim 7 wherein said register means includes switch means connected to said preamplifier means for selecting said four preamplifiers.

10. An electro-optical data retrieval system for retrieving data from a storage medium and of the type wherein relative motion is imparted between the recording medium and a pickup means for causing said data to be scanned for retrieval thereof, the position of the data being capable of variation relative to the pickup means, comprising:
means for receiving a data-bearing storage medium having a relatively high density of data tracks thereon,
illuminance means for illuminating at least an area of interest of said storage medium,
focusing means,
a matrix array of photosensitive elements, disposed relative to said storage medium such that said focusing means may focus an image of said area of interest onto said array of photosensitive elements, the image of a data track being no smaller than a single photosensitive element, said array being dimensioned such that the area of interest does not extend beyond the array even in the event the position of data in the area of interest varies relative to the array,
current-sensing preamplifier means and select circuit means associated with said photosensitive elements, said select circuit means being for selecting at least one of the photosensitive elements through said preamplifier means to provide an output signal responsive to said image impinging upon said photosensitive elements,
tracking means for detecting variations in the position of the data and thereby selecting the photosensitive element which provides the output signal in response to such variation,
velocity detection means including external clock means responsive to signals from at least one of said photosensitive elements for determining increases and decreases in the rotational velocity of said storage medium, and
switching means responsive to said velocity detection means for selecting from said photosensitive elements at least one of said elements positioned so that the information to be retrieved is present at that element at the proper time as determined by said velocity detection means.

11. The electro-optical data retrieval system of claim 10 wherein said storage medium is a rotating disc and each of said photosensitive elements in said matrix array is maintained in a continuously biased state.

12. The electro-optical data retrieval system of claim 11 wherein each photosensitive element in said matrix array of said detector means is continuously biased.

13. The electro-optical data retrieval system of claim 10 wherein said current-sensing preamplifier means includes at least one differential pair of transistors maintained in a continuously biased state.

14. The electro-optical data retrieval system of claim 13 further comprising
comparison means responsive to said signals from said amplifier means for determining which of said signals is most responsive to said area of interest of said illuminated storage medium.

15. An electro-optical data retrieval system for retrieving data from a relatively high density data storage medium and of the type wherein relative motion is imparted between the recording medium and a pickup means for causing said data to be scanned for the retrieval thereof, comprising:
illuminance means for illuminating an area of said storage medium,
detector means including a matrix array of photosensitive elements disposed in rows and columns, a plurality of said photosensitive elements in at least one of said rows being continually biased,
focusing means for focusing an image of an area of interest within said illuminated area of said storage medium onto said detector means, said array being dimensioned such that the area of interest does not extend beyond such array,
amplifier means for amplifying signals produced by a plurality of elements of said photosensitive array,
select circuit means for selecting at least one of said amplified signals to be provided as an output signal, said select circuit including register means,
velocity detecting means including external clock means responsive to signals from at least one of said photosensitive elements for determining increases and decreases in the rotational velocity of said storage medium, and
switching means responsive to said velocity detection means for selecting from said photosensitive elements at least one of said elements positioned so that the information to be retrieved is present at that element at the proper time as determined by said velocity detection means.

16. The electro-optical data retrieval system of claim 15, wherein said select circuit further includes comparator means for comparing said plurality of amplified signals and selecting as said output signal the strongest of said amplified signals.

17. The electro-optical data retrieval system of claim 16, wherein said register means is responsive to signals from said comparator means to cause a plurality of photosensitive elements whose signals are selected for amplification by said amplifying means to select at least one of said signals to cause said data retrieval system to follow variations of the position of said data track with respect to said array.

18. The electro-optical data retrieval system of claim 17, wherein the select circuit means continuously selects a plurality of photosensitive elements.

19. The electro-optical data retrieval system of claim 17, wherein the select circuit means selects a plurality of photosensitive elements at predetermined intervals.

20. An electro-optical data retrieval system for retrieving data from a storage disc wherein relative rotational motion is imparted between the storage disc and a pickup means for causing the disc to be scanned for retrieval of the stored data therefrom comprising:
   means for receiving a storage disc having data stored thereon in data tracks,
   illuminace means on one side of the storage disc for flooding with radiation an area of the storage disc greater than a primary area of interest of at least one data track,
   detector means adapted for connection to processing circuitry including a matrix array of photodiodes located on the other side of the storage disc,
   focusing means between the storage medium receiving plane and the detector means for focusing an image of at least a primary area of interest of the storage medium caused by the illuminance means onto the detector means, the array size being greater than permissible eccentricities in data track position,
   monitor circuit means for monitoring a plurality of photodiodes in the matrix array which receive the image of the primary area of interest and selecting, in accordance with a predetermined criteria, one of the plurality to provide an output signal, the monitoring circuit means including means for causing the photodiodes included in the monitored plurality of photodiodes to be reselected in the event an eccentricity in data track position causes the primary area of interest to extend beyond the monitored plurality of photodiodes,
   velocity detection means including external clock means responsive to signals from at least one of said photosensitive elements for determining increases and decreases in the rotational velocity of said storage medium, and
   switching means responsive to said velocity detection means for selecting from said photosensitive elements at least one of said elements positioned so that the information to be retrieved is present at that element at the proper time as determined by said velocity detection means.

21. The electro-optical data retrieval system of claim 20 wherein the monitor circuit means includes comparator means for comparing signals received from the monitored plurality of photodiodes, and selecting the strongest signal received from the plurality of photodiodes to provide an output signal.

22. The electro-optical data retrieval system claim 21, wherein the monitor circuit means further includes edge detect means for detecting movement of a data track position relative to the matrix array.

23. The electro-optical retrieval system of claim 22, wherein the monitor circuit means further includes counter means for counting signals from the edge detect means and register means responsive to the counter means for reselecting the monitored plurality of photodiodes in the event the edge detect means detects excessive movement of a data track position relative to the matrix array.

24. An electro-optical data retrieval system for retrieving data from a storage medium and of the type wherein relative motion is imparted between the recording medium and pickup means for causing said data to be scanned for retrieval thereof, comprising:
   means for receiving a data-bearing storage medium having a relatively high density of data tracks thereon,
   illuminance means for illuminating an area of said storage medium,
   detector means including a matrix array of photosensitive elements, said array having predetermined dimensions,
   focusing means for focusing an image of an area of interest within said illuminate area of said storage medium onto said detector means, the image of a data track being no smaller than a single photosensitive element, said array being dimensioned such that the area of interest does not extend beyond said array despite variations in the position of the area of interest with respect to the array due to variations in the location of the data relative to the detector means,
   select circuit means including means for selecting at least one of said photosensitive elements of said array to provide an output signal of the system, said means for selecting including register means for selecting at least one of said photosensitive elements,
   delay meams for delaying a signal representative of the same information from each of said photosensitive elements by a predetermined amount, said signal being provided at different times, and
   summing means for summing together the signals from each of said photosensitive elements, the amount of said delay being determined to cause each of said signals from said photosensitive elements to present at said summing means at substantially the same time, thereby increasing signal-to-noise ratio.

25. The electro-optical data retrieval system of claim 24 further comprising amplification means for amplifying signals produced by a plurality of elements of said photosensitive array, and said select circuit means provides an output signal of the system.

26. The electro-optical data retrieval system of claim 25 wherein said amplification means includes an amplifier for current-sensing.

27. The electro-optical data retrieval system of claim 25 wherein said amplification means includes preamplifier means associated with each of said elements of said photosensitive array, and said select circuit means having means to select at least one preamplifier means to provide the output signal of the system.

28. The electro-optical data retrieval system of claim 25 wherein said amplification means is responsive to the select circuit means and includes preamplifiers and means for maintaining said preamplifiers in a standby state except when selected by said select circuit means.

29. The electro-optical data retrieval system of claim 28 wherein said register means is provided for selecting a plurality of preamplifiers.

30. The electro-optical data retrieval system of claim 29 wherein said register means causes said plurality of said preamplifier means to supply signals to a plurality of said amplifier means, and said select circuit means further includes comparison means for selecting at least one of said amplifier means to provide said output signal.

31. The electro-optical data retrieval system of claim 30 wherein said register means selects four preamplifiers, and said amplifiers means comprises four amplifiers, each of said preamplifiers providing a signal to one of said amplifiers.

32. The electro-optical data retrieval system of claim 30 wherein said register means includes switch means connected to said preamplifier means for selecting said four preamplifiers.

33. An electro-optical data retrieval system for retreiving data from a storage medium and of the type wherein relative motion is imparted between the recording medium and a pickup means for causing said data to be scanned for retrieval thereof, the position of the data being capable of variation relative to the pickup means, comprising:
    means for receiving a data-bearing storage medium having a relatively high density of data tracks thereon,
    illuminance means for illuminating at least an area of interest of said storage medium,
    focusing means,
    a matrix array of photosensitive elements, disposed relative to said storage medium such that said focusing means may focus an image of said area of interest onto said array of photosensitive elements, the image of a data track being no smaller than a single photosensitive element, said array being dimensioned such that the area of interest does not extend beyond the array even in the event the position of data in the area of interest varies relative to the array,
    current-sensing preamplifier means and select circuit means associated with said photosensitive elements, said select circuit means being for selecting at least one of the photosensitive elements through said preamplifier means to provide an output signal responsive to said image impinging upon said photosensitive elements,
    tracking means for detecting variations in the position of the data and thereby selecting the photosensitive element which provides the output signal in response to such variation,
    delay means for delaying a signal representative of the same information from each of said photosensitive elements by a predetermined amount, said signal being provided at different times, and
    summing means for summing together the signals from each of said photosensitive elements, the amount of said delay being determined to cause each of said signals from said photosensitive elements to present at said summing means at substantially the same time, thereby increasing signal-to-noise ratio.

34. The electro-optical data retrieval system of claim 33 wherein said storage medium is a rotating disc and each of said photosensitive elements in said matrix array is maintained in a continuously biased state.

35. The electro-optical data retrieval system of claim 34 wherein each photosensitive element in said matrix array of said detector means is continuously biased.

36. The electro-optical data retrieval system of claim 33 wherein said current-sensing preamplifier means includes at least one differential pair of transistors maintained in a continuously biased state.

37. The electro-optical data retrieval system of claim 36 further comprising:
    comparison means responsive to said signals from said amplifier means for determining which of said signals is most responsive to said area of interest of said illuminated storage medium.

38. An electro-optical data retrieval system for retrieving data from a relatively high density data storage medium and of the type wherein relative motion is imparted between the recording medium and a pickup means for causing said data to be scanned for the retrieval thereof, comprising:
    illuminance means for illuminating an area of said storage medium,
    detector means including a matrix array of photosensitive elements disposed in rows and columns, a plurality of said photosensitive elements in at least one of said rows being continually biased,
    focusing means for focusing an image of an area of interest within said illuminated area of said storage medium onto said detector means, said array being dimensioned such that the area of interest does not extend beyond such array,
    amplifier means for amplifying signals produced by a plurality of elements of said photosensitive array,
    select circuit means for selecting at least one of said amplified signals to be provided as an output signal, said select circuit including register means,
    delay means for delaying a signal representative of the same information from each of said photosensitive elements by a predetermined amount, said signal being provided at different times, and
    summing means for summing together the signals from each of said photosensitive elements, the amount of said delay being determined to cause each of said signals from said photosensitive elements to present at said summing means at substantially the same time, thereby increasing signal-to-noise ratio.

39. The electro-optical data retrieval system of claim 38, wherein said select circuit further includes comparator means for comparing said plurality of amplified signals and selecting as said output signal the strongest of said amplified signals.

40. The electro-optical data retrieval system of claim 39, wherein said register means is responsive to signals from said comparator means to cause a plurality of photosensitive elements whose signals are selected for amplification by said amplifying means to select at least one of said signals to cause said data retrieval system to follow variations of the position of said data track with respect to said array.

41. The electro-optical data retrieval system of claim 40, wherein the select circuit means continuously selects a plurality of photosensitive elements.

42. The electro-optical data retrieval system of claim 40, wherein the select circuit means selects a plurality of photosensitive elements at predetermined intervals.

43. An electro-optical data retrieval system for retrieving data from a storage disc wherein relative rotational motion is imparted between the storage disc and a pickup means for causing the disc to be scanned for retrieval of the stored data therefrom comprising:

means for receiving a storage disc having data stored thereon in data tracks, illuminance means on one side of the storage disc for flooding with radiation an area of the storage disc greater than a primary area of interest of at least one data track, detector means adapted for connection to processing circuitry including a matrix array of photodiodes located on the other side of the storage disc, focusing means between the storage medium receiving plane and the detector means for focusing an image of at least a primary area of interest of the storage medium caused by the illuminance means onto the detector means, the array size being greater than permissible eccentricities in data track position, monitor circuit means for monitoring a plurality of photodiodes in the matrix array which receive the image of the primary area of interest and selecting, in accordance with a predetermined criteria, one of the plurality to provide an output signal, the monitoring circuit means including means for causing the photodiodes included in the monitored plurality of photodiodes to be reselected in the event an eccentricity in data track position causes the primary area of interest to extend beyond the monitored plurality of photodiodes, delay means for delaying a signal representative of the same information from each of said photosensitive elements by a predetermined amount, said signal being provided at different times, summing means for summing together the signals from each of said photosensitive elements, the amount of said delay being determined to cause each of said signals from said photosensitive elements to present at said summing means at substantially the same time, thereby increasing signal-to-noise ratio.

44. The electro-optical data retrieval system of claim 43 wherein the monitor circuit means includes comparator means for comparing signals received from the monitored plurality of photodiodes, and selecting the strongest signal received from the plurality of photodiodes to provide an output signal.

45. The electro-optical data retrieval system of claim 44, wherein the monitor circuit means further includes edge detect means for detecting movement of a data track position relative to the matrix array.

46. The electro-optical retrieval system of claim 68, wherein the monitor circuit means further includes counter means for counting signals from the edge detect means and register means responsive to the counter means for reselecting the monitored plurality of photodiodes in the event the edge detect means detects excessive movement of a data track position relative to the matrix array.

* * * * *